US007160635B2

(12) United States Patent
Leyens et al.

(10) Patent No.: US 7,160,635 B2
(45) Date of Patent: Jan. 9, 2007

(54) PROTECTIVE TI-AL-CR-BASED NITRIDED COATINGS

(75) Inventors: Christoph Leyens, Königswinter (DE); Papken Ehiasar Hovsepian, Sheffield (GB); Wolf-Dieter Munz, Vienna (AT)

(73) Assignee: Sheffield Hallam University (GB)

( * ) Notice: Subject to any disclaimer, the term of this patent is extended or adjusted under 35 U.S.C. 154(b) by 0 days.

(21) Appl. No.: 10/984,725

(22) Filed: Nov. 9, 2004

(65) Prior Publication Data
US 2006/0099455 A1 May 11, 2006

(51) Int. Cl.
B32B 15/04 (2006.01)
B32B 18/00 (2006.01)
(52) U.S. Cl. .................. 428/698; 416/241 B; 428/469
(58) Field of Classification Search ................. 428/698
See application file for complete search history.

(56) References Cited

U.S. PATENT DOCUMENTS 5,997,248 A * 12/1999 Ghasripoor et al. ...... 415/173.4
6,033,768 A 3/2000 Muenz et al.

FOREIGN PATENT DOCUMENTS

EP 1 132 498 A1 9/2001
EP 1 219 723 A2 7/2002
EP 1 431 416 A1 6/2004
JP 04-128363 4/1992

OTHER PUBLICATIONS

Lewis, D.B., et al.; "The influence of the yttrium content on the structure and properties of $Ti_{1-x-y-z}Al_xCr_yY_zN$ PVD hard coatings"; Surface & Coatings Technology, vol. 114 (1999) p. 187-199.
Donohue, L.A., et al.; "The influence of low concentrations of chromium and yttrium on the oxidation behaviour, residual stress and corrosion performance of TiAlN hard coatings on steel substrates"; Vacuum, vol. 55 (1999) p. 109-114.
Donohue, L.A., et al.; "Microstructure and oxidation-resistance of $Ti_{1-x-y-z}Al_xCr_yY_zN$ layers grown by combined steered-arc/unbalanced-magnetron-sputter deposition"; Surface & Coatings Technology, vol. 94-95 (1997) p. 226-231.
Huang, Feng, et al.; "Microstructure and stress development in magnetron sputtered TiAlCr(N)ifms"; Surface & Coatings Technology, vol. 146-147 (2001) p. 391-397.

* cited by examiner

Primary Examiner—Jennifer C. McNeil
Assistant Examiner—Aaron Austin
(74) Attorney, Agent, or Firm—Trexler, Bushnell, Giangiorgi, Blackstone & Marr, Ltd

(57) ABSTRACT

This invention relates to coatings for the protection of substrates operating at moderately elevated temperatures, and, more particularly, for the protection of titanium-alloy aircraft and stationary gas turbine components as well as engine components for automotive applications, articles having such coatings and a method for their production.

23 Claims, 4 Drawing Sheets

PROTECTIVE TI-AL-CR-BASED NITRIDED COATINGS

FIELD OF THE INVENTION

This invention relates to coatings for the protection of substrates operating at moderately elevated temperatures, and, more particularly, for the protection of titanium-alloy aircraft and stationary gas turbine components as well as engine components for automotive applications, articles having such coatings and a method for their production.

BACKGROUND TO THE INVENTION

Improving the efficiency or the specific power of a gas turbine or a combustion engine requires, among others, an increase in combustion gas temperatures. For example, for gas turbines, the efficiency can be improved by increasing the turbine inlet temperature. However, the maximum exhaust gas temperature is normally limited by the materials used to fabricate the vanes and blades in the high pressure turbine part of the engine. Today, nickel-base superalloys are used in high pressure turbines which are capable of service temperatures up to about 1150° C. for long-term applications (several thousand hours). Although these temperatures more or less mark the upper temperature limit for the class of superalloys with melting ranges of from about 1230 to 1400° C., the gas temperatures in current engines can be raised by a variety of techniques, such as improved cooling technologies and thermal barrier coatings.

As a consequence of higher exhaust gas temperatures in high-pressure turbines, the other components of the gas turbine engine must operate at higher temperatures as well. These components include rotating and static parts, such as high pressure compressor airfoils, low pressure turbine airfoils and combustors.

The materials used for these components must usually meet low weight and increased operating temperature requirements. Therefore, in particular for aircraft engine and automotive applications, titanium alloys and titanium aluminides have been developed and introduced into such components. For stationary gas turbines, weight reduction is less a driver for materials development and/or replacement, however, the benefit obtained from light weight materials is obviously based on reduced forces placed on the shafts by using light weight rotating components (e.g. blades).

At moderately elevated temperatures of from about 500 to 900° C., the alloys used are exposed to severe environmental attack during service. Depending on the temperature and the operating environment (air, combustion atmosphere, particle-loaded gas, solid/solid friction), the modes of attack include hot corrosion, oxidation, erosion, and wear. Most alloys selected for good mechanical properties and low weight are susceptible to these types of attack.

It is therefore necessary to protect the components from environmental attack. One common approach is to use protective coatings to resist the modes of damage mentioned above while using the mechanical properties of the structural material forming the component.

Although numerous coating systems designed for protection of high-temperature alloys could be used for e.g. titanium alloys, these coatings do not meet the requirements for a variety of reasons. E.g. coatings used for protection of nickel-base superalloys, such as MCrAly-type overlay coatings, form brittle phases and degrade the mechanical properties when applied to titanium alloys and titanium aluminides. Furthermore, interdiffusion between the MCrAlY-type overlay coating and the titanium alloy or titanium aluminides substrate alloy can lead to several other modes of degradation such as pore formation at the coating-substrate interface, loss of protectiveness of the coating, reduced lifetime of the coating and the entire system, etc. Other coating systems that have been investigated in the past, such as oxide ceramic coatings, are inherently brittle and thus degrade the mechanical properties of the titanium alloy or the titanium aluminide substrate material, particularly fatigue resistance. Furthermore, with increasing gas temperatures in gas turbines of combustion engines there might be the need for thermal insulation of components such that these can be used at temperatures exceeding the limit given by their mechanical properties.

Thus, there is a need for an environmental and thermal protection system, in particular for titanium alloys and titanium aluminides to be used at moderately elevated temperatures, particularly in hostile environments.

SUMMARY OF THE INVENTION

According to the invention, The problem is solved by a coating on a metal substrate, the coating contacting and overlying at least a portion of the substrate surface; the coating comprising a nitride layer contacting the substrate surface and having a composition, in atomic percent, of from 5 to 30% titanium, of from 10 to 40% aluminium, of from 1 to 40% chromium, of from 0 to 3% yttrium, of from 40 to 60% nitrogen, plus incidental impurities.

The microstructure of said nitride layer may preferably be monolithically grown nitride or superlattice structure nitride.

If the microstructure of said nitride layer is monolithically grown nitride it has a preferred composition in atomic percent, of from 10 to 30% titanium, of from 20 to 40% aluminium, of from 1 to 7% chromium, of from 0 to 3% yttrium, of from 40 to 60% nitrogen, plus incidental impurities.

If the microstructure of said nitride layer is superlattice structure nitride, it has a preferred composition, in atomic percent, of from about 5 to 25% titanium, of from about 10 to 30% aluminium, of from about 0 to 3% yttrium, of from about 20 to 40% chromium, of from about 40 to 60% nitrogen, plus incidental impurities.

The coating according to the invention may further comprise an additional oxi-nitride layer contacting and overlying the surface of the nitride layer. The oxi-nitride layer comprises a superlattice type interlayer with TiAlYN and CrN layers and a glassy overcoat region. The oxi-nitride layer having a composition, in atomic percent, of from about 40 to 50% chromium, of from about 30 to 40% aluminium, of from about 20 to 30% titanium, of from about 0.5 to 1.5% yttrium, plus oxygen, plus nitrogen, plus incidental impurities for the interlayer and of from about 5 to 50% chromium, of from about 30 to 55% aluminium, of from about 1 to 2% yttrium plus oxygen plus nitrogen plus incidental impurities for the glassy overcoat.

The substrate composition is preferably an alloy comprising titanium and aluminium and/or selected from the group consisting of a near-alpha titanium alloy, an alpha+beta titanium alloy, an alpha-2 titanium aluminide alloy, an orthorhombic titanium aluminide alloy, and an gamma titanium aluminide alloy.

The coating according to the invention may further comprise a ceramic layer contacting and overlying the nitride layer, such that the nitride layer lies between the ceramic layer and the substrate.

The ceramic layer may be yttria stabilized zirconia, an oxide from the group of perowskites, pyrochlores, yttrium aluminium garnet-based ceramics.

Thereby an article is provided comprising a metal substrate having a substrate composition and a substrate surface, having thereon a coating according to the invention. The substrate of this article preferably is a titanium containing substrate.

The article according to the invention preferably has a substrate which is a component of an aircraft gas turbine, a stationary gas turbine or an engine part for automotive applications.

An article according to the invention is preferably prepared by applying a coating according to the invention to contact and overlie at least a portion of the substrate surface. This method may comprise a step of metal ion etching the substrate before applying the coating.

The present invention thereby provides a protective nitride coating system, in particular on a titanium-alloy article suitable for moderately elevated temperature applications in hostile environments, and a method for preparing such a coating and article. The nitride coating according to the invention provides oxidation and hot corrosion resistance to the underlying substrate. Due to the high hardness and/or the specific microstructure, the coating also exhibits a low friction coefficient, and is wear resistant as well as erosion resistant. The coating is thermally stable at moderately elevated temperatures up to several thousand hours. Adhesion of the coating is excellent due to the presence of a tailored interface between the nitride coating and the substrate alloy.

In accordance with the invention, an article having a protective coating thereon preferably comprises a titanium-alloy having a substrate composition and a substrate surface, and a protective coating contacting and overlying at least a portion of the substrate surface. The protective coating comprises a nitride layer contacting the substrate surface and having a composition, in atomic percent, of from 5 to 30% titanium, of from 10 to 40% aluminium, of from 1–40% Cr, of from 0 to 3%, preferably 1 to 2.5% yttrium, of from about 40–60%, preferably 40 to 50% nitrogen, plus incidental impurities. The microstructure of the coating should be either monolithically grown nitride or superlattice structure nitride.

In one application, the protective nitride layer can be overlaid by an oxi-nitride layer to seal the surface and to further improve the protectiveness of the coating. Furthermore, the oxi-nitride layer modifies the friction of the surface.

In one application, the protective nitride layer as well as the protective coating comprising an oxi-nitride layer serves as a bond coat in a thermal barrier coating system. In that case the protective coating further comprises a ceramic layer, such as yttria-stabilized zirconia, pychlores, perowskites, yttrium aluminium garnet oxides, contacting and overlying the nitride layer or the oxi-nitride layer, such that the nitride layer or the nitride/oxi-nitride duplex layer lies between the ceramic layer and the substrate.

In another application the protective nitride layer or the nitride/oxi-nitride duplex layer reduces the friction between the coated article and another friction counterpart. In this case, no ceramic layer overlies the nitride or the nitride/oxi-nitride duplex layer.

The metal substrate for the protective coating preferably is a titanium-containing alloy, such as a conventional titanium alloy, an alpha-2 titanium aluminide, an orthorhombic titanium aluminide or a gamma titanium aluminide. Such alloys provide good mechanical properties at moderately elevated temperature applications, however, they are usually not resistant to environmental damage experienced in gas turbines and combustion engines. The nitride coatings according to the invention protect such titanium substrates against environmental damage. The compatibility of the coating, i.e. mainly the coefficient of thermal expansion and chemical interaction, with the substrates is sufficient to obtain long lifetimes with regards to coating integrity. Furthermore, the high hardness and wear resistance of the coating provides protection against friction wear and erosion; these modes of attack are relevant to both gas turbine and automotive applications. When a thermal barrier coating is applied over the metallic layer bond coat, the coating also provides thermal insulation for the component.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION

There will now be described by way of example a specific mode contemplated by the inventors. In the following description numerous specific details are set forth in order to provide a thorough understanding. It will be apparent however, to one skilled in the art, that the present invention may be practiced without limitation to these specific details.

Figure 1:
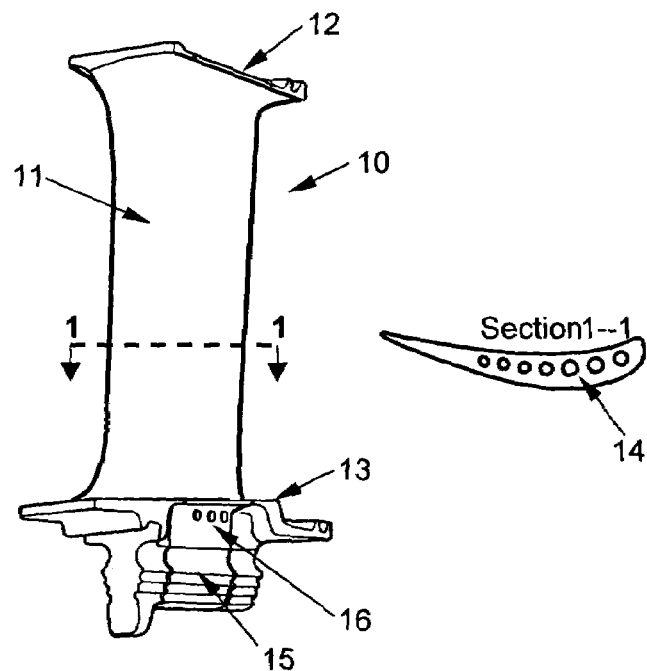
FIG. 1 is a schematic perspective view of a gas turbine component, including a schematic sectional view along line 1—1.

FIG. 1 depicts, by way of example, a component of a gas turbine engine such as a turbine blade or vane, in this case a high pressure turbine blade (10). The turbine blade (10) includes an airfoil (11) which is exposed to the hot gas flow.

The turbine blade is mounted to a disk (not shown) by a dovetail (15). A platform (13) extends outwardly from the area where the airfoil (11) is joined to the platform (13). A second platform (12) which extends to the casing (not shown) of the complete rotor (not shown) is joined at the tip of the blade. Optionally a number of cooling channels (14) extend through the interior of the airfoil (11), ending at the blade tip platform (12). During service, a flow of cooling air is directed through the cooling channels to reduce the temperature of the airfoil (11). Although the invention is illustrated in relation to this preferred embodiment of a titanium-alloy gas turbine component, the coating approach is equally applicable to other titanium-alloy components, such as compressor blades and vanes, exhaust structures, valves, and the like.

The airfoil (11) of the turbine blade (10) is protected by a protective coating (20). FIG. 2a to 2d depicts four embodiments. The protective coating (20) is present at the surface (26) of the airfoil (10) which serves as a substrate (21) for the protective coating (20).

Figure 2A:
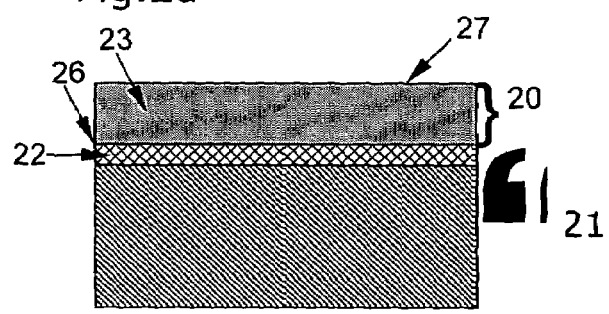
FIG. 2*a* is a schematic sectional view through the component of FIG. 1 along line 1—1, showing one embodiment of the invention.
Figure 2B:
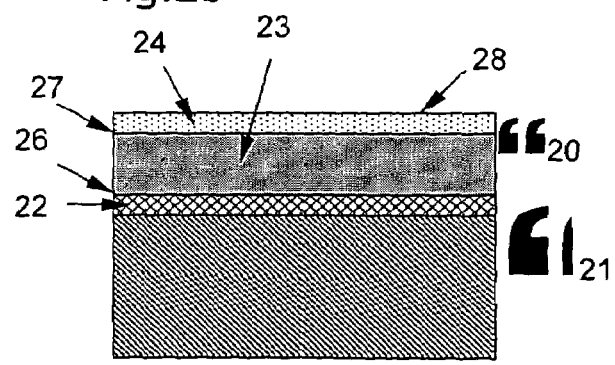
FIG. 2*b* is a schematic sectional view through the component of FIG. 1 along line 1—1, showing a second embodiment of the invention.
Figure 2C:
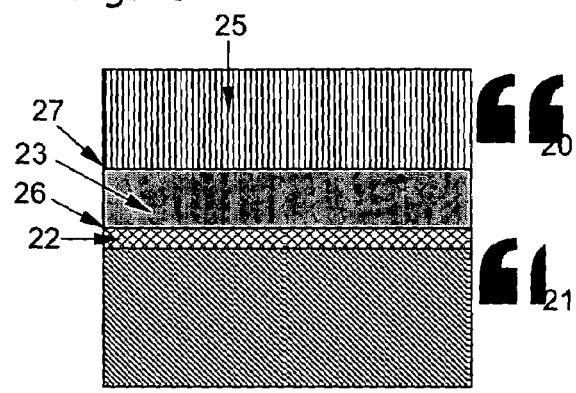
FIG. 2*c* is a schematic sectional view through the component of FIG. 1 along line 1—1, showing a third embodiment of the invention.
Figure 2D:
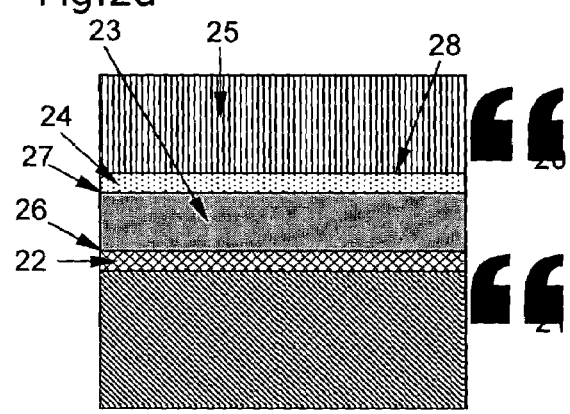
FIG. 2*d* is a schematic sectional view through the component of FIG. 1 along line 1—1, showing a fourth embodiment of the invention.

In the embodiment of FIG. 2a, the protective coating (20) comprises a nitride layer (23) located at the surface (26) of the substrate (21). The surface (26) of the substrate (21) was modified by metal ion etching prior to deposition of the nitride layer (23), resulting in a metal ion-enriched subsurface zone (22). This metal ion-enriched zone (22) preferably extends only a few nanometers into the material of substrate (21). In the embodiment of FIG. 2b, the protective coating (20) comprises a metal ion-enriched subsurface zone (22) underneath the surface (26) of the substrate (21) overlaid by a nitride layer (23) and an oxi-nitride top layer (24) overlying the surface (27) of the nitride layer (23). In the embodiment of FIG. 2c, the protective coating (20) comprises a metal ion-enriched subsurface zone (22) underneath the surface (26) of the substrate (21) overlaid by a nitride layer (23) and a ceramic layer (25) overlying the surface (27) of the nitride layer (23). The protective coating shown in FIG. 2c, including the nitride layer (23) (in this context termed a bond coat) and the ceramic layer (25), is sometimes termed a thermal barrier coating system. In the embodiment of FIG. 2d, the protective coating (20) comprises a metal ion-enriched subsurface zone (22) underneath the surface (26) of the substrate (21) overlaid by a nitride layer (23) and an oxi-nitride top layer (24) overlying the surface (27) of the nitride layer (23); the surface (28) of the oxi-nitride layer (24) is overlaid by a ceramic layer (25). In analogy to the embodiment of FIG. 2c, this protective coating is sometimes termed a thermal barrier coating.

The metal ion-etched zone (22) may be of any operable thickness and the type of ions is preferably Cr and Nb, but not restricted to these.

The nitride layer (23) may be of the same or different structures and compositions, including monolithically grown and superlattice coating structures, within the scope of the invention for the embodiments of FIG. 2a–d. The nitride layer (23) may be of any operable thickness, but is typically on the order of a few micrometers thick, preferably of from about 1–3 micrometers.

The thickness of the oxi-nitride layer (24) may be of any operable thickness and may be of various structures and compositions, within the scope of the invention for the embodiments of FIGS. 2b and 2d. The thickness of the oxi-nitride coating is preferably from about 0.2 to 0.6 micrometers.

Figure 3:
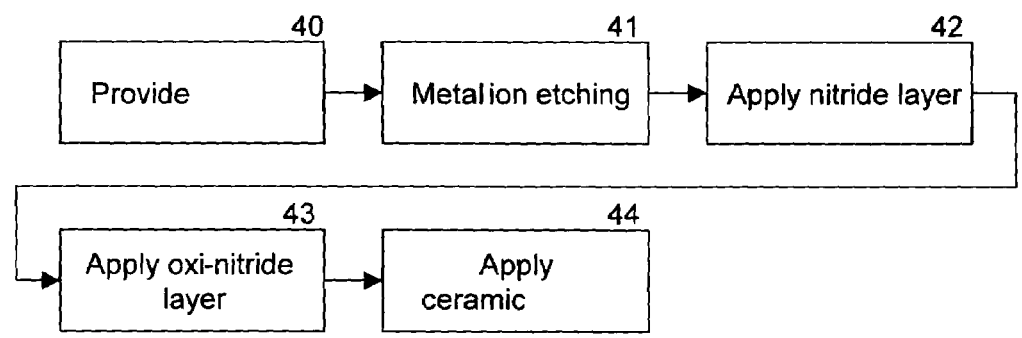
FIG. 3 is a block flow diagram for a method for applying a protective coating to the substrate.

A preferred method for practicing the invention is depicted in FIG. 3. The substrate (21) is provided, numeral 40. The substrate is formed to the required shape by an appropriate technique, such as casting or forging. The preparation of the basic substrate is known in the art for each specific type of substrate.

The substrate (21) is preferably made of a titanium-containing alloy. The preferred alloys are, or are based upon, alpha-2 titanium aluminides (Ti3Al), orthorhombic titanium aluminides (Ti—Al—Nb system) and gamma titanium aluminides (TiAl). These alloys may contain alloying additions such as chromium, tantalum, tungsten and silicon. These titanium alloys are, or can be, used in moderately elevated temperature gas turbine and automotive applications. The coating system of the invention is also operable with other titanium alloys such as, for example, alpha+beta alloys and near-alpha alloys.

The surface (26) of the substrate (21) is prepared for application of the protective coating. Since the coatings applied are only a few micrometers thick, the preferred surface (26) is polished, using any operable method. It is thereafter cleaned of residue with a solvent and/or alkaline cleaning solution used in an ultrasonic bath.

Figure 4:
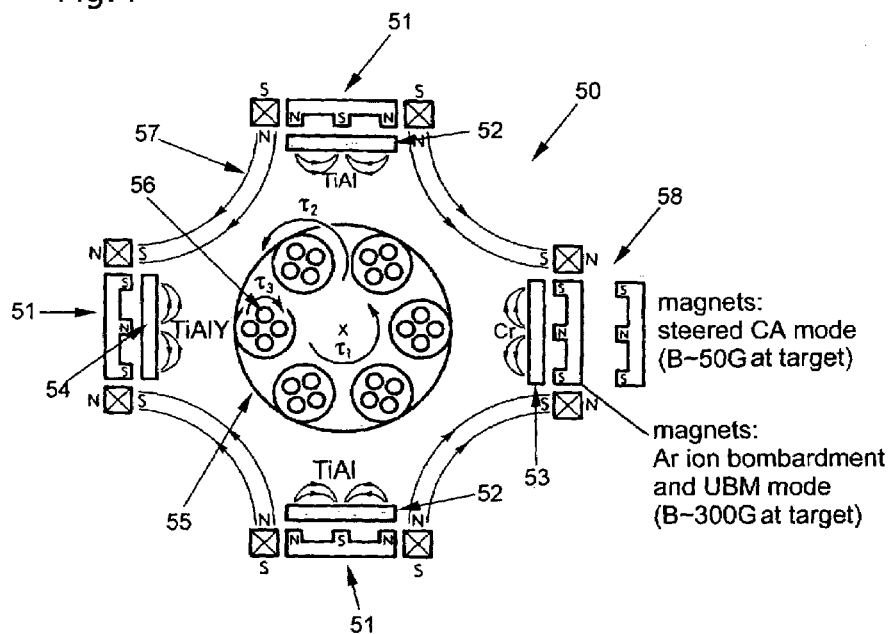
FIG. 4 is a schematic drawing of the coating apparatus used for nitride- and oxi-nitride layer deposition.

Metal ion etching and nitride coating deposition can be obtained using any operable technique. The preferred approach is a combined cathodic arc/unbalanced sputtering technique. FIG. 4 depicts a schematic drawing of a coater (50). Two opposing cathodes (51) were equipped with TiAl targets (52). The other two positions were occupied by a chromium target (53) and a TiAlY (54) target containing 4 at. % yttrium. The TiAl (52) and TiAlY (54) targets were operated in unbalanced magnetron deposition mode, whereas the chromium target (53) was either operated in steered cathodic arc mode (58) or in unbalanced magnetron mode. All substrates (56) were subjected to a threefold rotation and the substrate table (55) was rotated at a frequency of 7.5 rev/min. Before deposition all targets (52–54) were sputter cleaned for 10 min at a pressure of $2.4\times10$ mbar. The deposition starts with cathodic arc chromium metal ion etch of the substrate surfaces (26) to form a well defined interface (22) which allows localized epitaxial growth of the growing film to achieve sufficiently high adhesion, numeral 41. The nitride layers (23), either monolithically grown or superlattice type, were deposited in unbalanced magnetron mode using two TiAl targets (52), a chromium target (53) and a TiAlY target (54), numeral 42. During deposition a substrate temperature of 450° C. and a bias voltage of –75V was applied. Condensation took place in a mixed Ar+N2 atmosphere. The oxi-nitride layer comprised of an interlayer and an overcoat region. To achieve a sufficiently strong mechanical support for the glassy and extremely smooth oxi-nitride layer, a thin particularly hard superlattice type coating was grown, numeral 43. By decreasing the power on the chromium target stepwise, an interlayer with TiAlYN and CrN was produced. These conditions were held for several minutes, then the chromium target power was gradually decreased. In parallel, the nitrogen gas flow was progressively reduced and gradually replaced by medical dry air. In this way, a chromium and oxygen containing TiAl oxide surface was obtained (28).

The nitride layer has a composition of from about 5 to 30% titanium, of from about 10 to 40% aluminium, of from about 1 to 40% Cr, of from about 0 to 3% yttrium, of from about 40 to 60% nitrogen, plus incidental impurities. The preferred microstructure of the nitride coating is either a monolithic microstructure or a superlattice structure, the structure and composition of which within the scope of this invention.

The composition of the monolithically grown nitride layer comprises, in atomic percent, from about 10 to 30% titanium, from about 20 to 40% aluminium, from about 1 to 7% chromium, from about 0 to 3% yttrium, from about 40 to 60% nitrogen, plus incidental impurities. The preferred composition of the monolithically grown nitride layer, in atomic percent, is from about 20 to 24% titanium, from about 23 to 26% aluminium, from about 0.5 to 1.5% yttrium, from about 1 to 3% chromium, balance nitrogen.

The composition of the superlattice nitride layer comprises, in atomic percent, from about 5 to 25% titanium, from about 10 to 30% aluminium, from about 0 to 3% yttrium, from about 20 to 40% chromium, from about 40 to 60% nitrogen, plus incidental impurities. The preferred composition is of the superlattice type nitride layer, in atomic percent, is from about 10 to 12% titanium, from about 10 to 14% aluminium, from about 0.5 to 1.5% yttrium, from about 24 to 28% chromium, balance nitrogen.

The composition of the nitride layer is selected with regard to oxidation protection of the substrate alloy by the formation of a protective oxide scale, preferably aluminium oxide. Furthermore, wear and erosion resistance can be tailored by adjusting the composition of the nitride layer. Yttrium or other reactive elements such as Zr and Hf are needed to block the outward diffusion of substrate elements, thereby improving oxidation resistance of the nitride coating.

The oxi-nitride layer (24) is applied to the surface (27) of the nitride layer (23), numeral 43 using any operable technique. The preferred method is a combined cathodic arc/unbalanced sputtering technique, FIG. 4. The oxi-nitride layer (24) is selected to further improve oxidation resistance and, due to its smooth and glassy microstructure, to reduce friction and wear. The oxi-nitride layer (24) comprises a superlattice type interlayer with TiAlYN and CrN layers and a glassy overcoat region. The oxi-nitride layer (24) having a composition, in atomic percent, of from about 40 to 50% chromium, of from about 30 to 40% aluminium, of from about 20 to 30% titanium, of from about 0.5 to 1.5% yttrium, plus oxygen, plus nitrogen, plus incidental impurities for the interlayer. The preferred composition of the interlayer of the oxi-nitride layer is, in atomic percent, from about 40 to 44% chromium, from about 30 to 34% aluminium, from about 20–25% titanium, about 1% yttrium, balance nitrogen. The overcoat has a compositional gradient from the interlayer towards the outer surface, having a preferred composition gradient from about 40 to 5% for chromium, from about 35 to 50% for aluminium, from about 25 to 30% for titanium and from about 1 to 1.5% for yttrium. The oxygen content is gradually increased towards the outer surface while the nitrogen content is gradually reduced.

The ceramic layer (25) is applied to the surface (28) of the oxi-nitride layer (24), numeral 44. Any operable ceramic layer (25) may be applied by any operable technique. In the preferred approach the ceramic layer (25) is yttria stabilized zirconia with zirconia being stabilized by 6–8 wt. % yttria. The preferred yttria stabilized zirconia is preferably applied by electron-beam physical vapor deposition, but other techniques such as inert gas, air, or vacuum plasma spraying, sputtering and chemical vapor deposition may be used as well. The thickness of the ceramic layer (25) may be of any operable thickness and the ceramic layer may be of various structures and compositions, preferably 150–200 micrometers, and the ceramic layer may be of various structures, preferably columnar or micro-cracked microstructure, and various composition, preferably 7 wt. % yttria stabilized zirconia.

A series of tests of protective coatings comprising according to the invention the monolithic and superlattice nitride layers, some overlaid with nitride/oxi-nitride layers, on various titanium-containing substrate alloys was performed to verify operability of the invention.

Figure 5A:
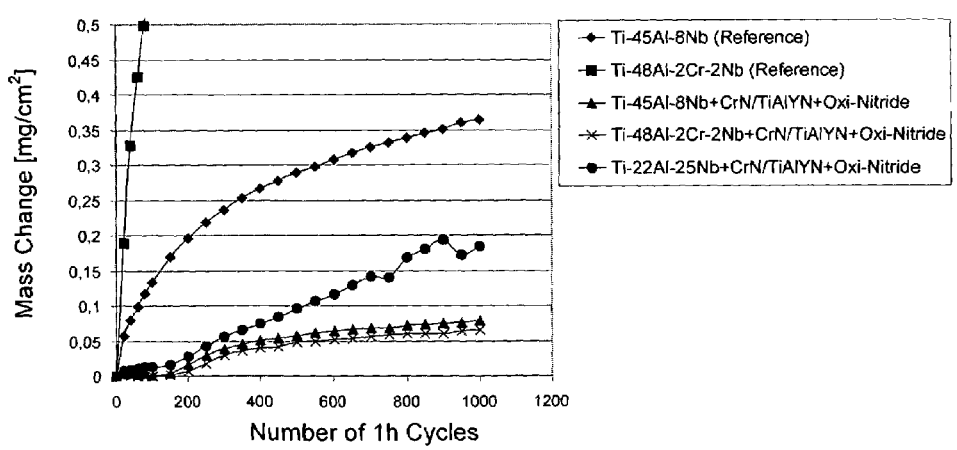
FIG. 5*a* is a mass change vs. number of 1-h cycles plot for various substrate alloys coated with superlattice nitride/oxi-nitride duplex coatings. Tests were performed cyclically at 750° C. in air. Uncoated Ti-45Al-8Nb and Ti-48Al-2Cr-2Nb are included as reference material.
Figure 5B:
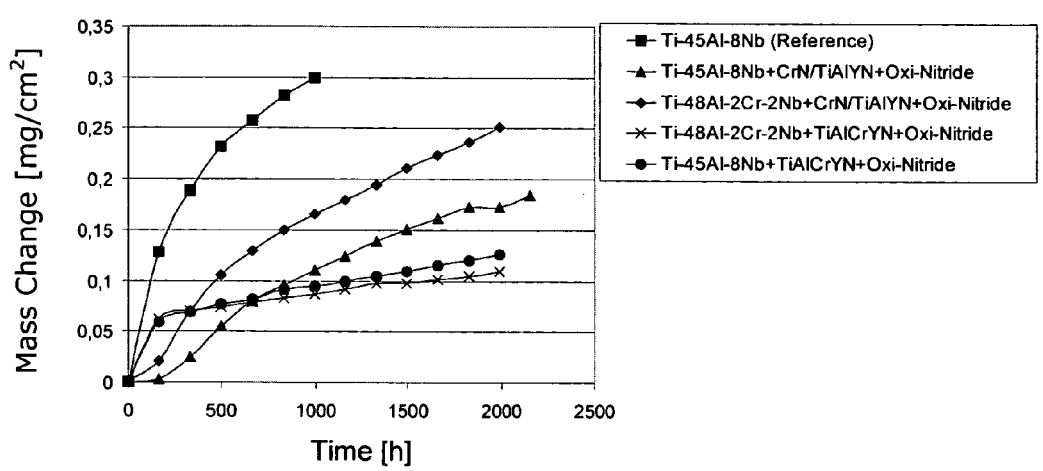
FIG. 5*b* is a mass change vs. time plot for various substrate alloys coated with superlattice nitride/oxi-nitride duplex coatings. Tests were performed isothermally at 750° C. in air. Uncoated Ti-45Al-8Nb is included as reference material.

FIG. 5 illustrates the oxidation behavior of the protected substrate materials under isothermal (FIG. 5a) and thermal cyclic (FIG. 5b) conditions. Two gamma titanium alloys were included as reference materials. The test duration was 1000 h in the case of cyclic testing and 2000 h for isothermal exposure. Under both conditions, the weight gain curves revealed formation of protective oxide scales on most substrates. The steady increase in weight of the coated orthorhombic substrate (Ti-22Al-25Nb) is caused by rapid oxidation of an uncoated spot on the samples which remained after removal of a holder need for coating processing purposes. The oxide scales formed on the intact parts of the samples exhibited thin protective oxide scale. Neither scale spallation nor any delamination of the coating from the substrate was observed, indicating excellent mechanical compatibility between the substrate, the protective coating and the oxide scale that formed during exposure.

Extensive post-oxidation microstructural analysis of the nitride/oxi-nitride duplex coatings revealed excellent chemical stability of the coatings and marginal interdiffusion with the substrate.

This invention has been described in connection with specific embodiments and examples. However, those skilled in the art will recognize various modifications and variations of which the present invention is capable without departing from its scope by the appended claims.

The invention claimed is:

1. A coating on a metal substrate, the coating contacting and overlying at least a portion of the substrate surface; the coating comprising a nitride layer contacting the substrate surface and having a composition, in atomic percent, of from 5 to 30% titanium, of from 10 to 40% aluminium, of from 1 to 40% chromium, of from 0 to 3% yttrium, of from 40 to 60% nitrogen, plus incidental impurities, wherein additional oxi-nitride layer is contacting and overlying the surface of the nitride layer; the oxi-nitride layer comprising a superlattice type interlayer with TiAlYN and CrN layers and a glassy overcoat region.

2. A coating according to claim 1, wherein the microstructure of the nitride layer is monolithically grown nitride or superlattice structure nitride.

3. A coating according to claim 2, wherein the microstructure of the nitride layer is monolithically grown nitride, having a composition, in atomic percent of from 10 to 30% titanium, of from 20 to 40% aluminium, of from 1 to 7% chromium, of from 0 to 3% yttrium, of from 40 to 60% nitrogen, plus incidental impurities.

4. A coating according to claim 2 wherein the microstructure of the nitride layer is superlattice structure nitride, having a composition, in atomic percent, of from about 5 to 25% titanium, of from about 10 to 30% aluminium, of from about 0 to 3% yttrium, of from about 20 to 40% chromium, of from about 40 to 60% nitrogen, plus incidental impurities.

5. A coating according to claim 1, wherein the oxi-nitride layer has a composition, in atomic percent, of from about 40 to 50% chromium, of from about 30 to 40% aluminium, of from about 20 to 30% titanium, of from about 0.5 to 1.5% yttrium, plus oxygen, plus nitrogen, plus incidental impurities for the interlayer and from about 5 to 50% chromium, of from about 30 to 55% aluminium, of from about 1 to 2% yttrium, plus oxygen, plus nitrogen, plus incidental impurities for the glassy overcoat.

6. A coating according to claim 1 wherein the substrate composition is an alloy comprising titanium and aluminium.

7. A coating according to claim 1, wherein the substrate composition is selected from the group consisting of a near-alpha titanium alloy, an alpha+beta titanium alloy, an alpha-2 titanium aluminide alloy, an orthorhombic titanium aluminide alloy, and a gamma titanium aluminide alloy.

8. A coating according to claim 1, wherein the coating further comprises a ceramic layer contacting and overlying the nitride layer, such that the nitride layer lies between the ceramic layer and the substrate.

9. A coating according to claim 8, wherein the ceramic layer is yttria stabilized zirconia, further comprising an oxide selected from the group consisting of perowskites, pyrochlores, and yttrium aluminium garnet-based ceramics.

10. An article comprising a metal substrate having a substrate composition and a substrate surface, having thereon a coating, the coating contacting and overlying at least a portion of the substrate surface; the coating comprising a nitride layer contacting the substrate surface and having a composition, in atomic percent, of from 5 to 30% titanium, of from 10 to 40% aluminium, of from 1 to 40% chromium, of from 0 to 3% yttrium, of from 40 to 60% nitrogen plus incidental impurities, wherein an additional oxi-nitride layer is contacting and overlying the surface of the nitride layer; the oxi-nitride layer comprising a superlattice type interlayer with TiAlYN and CrN layers and a glassy overcoat region.

11. An article according to claim 10, wherein the substrate is a titanium containing substrate.

12. An article according to claim 10, wherein the substrate is a component of an aircraft gas turbine, a stationary gas turbine or an engine part for automotive applications.

13. A coating on a metal substrate, the coating contacting and overlying at least a portion of the substrate surface; the coating comprising a nitride layer contacting the substrate surface and having a composition, in atomic percent, of from 5 to 30% titanium, of from 10 to 40% aluminium, of from 1 to 40% chromium, of from 0 to 3% yttrium, of from 40 to 60% nitrogen, plus incidental impurities, wherein the coating further comprises a ceramic layer contacting and overlying the nitride layer, such that the nitride layer lies between the ceramic layer and the substrate.

14. A coating according to claim 13, wherein the microstructure of the nitride layer is monolithically grown nitride or superlattice structure nitride.

15. A coating according to claim 14, wherein the microstructure of the nitride layer is monolithically grown nitride, having a composition, in atomic percent, of from 10 to 30% titanium, of from 20 to 40% aluminium, of from 1 to 7% chromium, of from 0 to 3% yttrium, of from 40 to 60% nitrogen, plus incidental impurities.

16. A coating according to claim 14, wherein the microstructure of the nitride layer is superlattice structure nitride, having a composition, in atomic percent, of from about 5 to 25% titanium, of from about 10 to 30% aluminium, of from about 0 to 3% yttrium, of from about 20 to 40% chromium, of from about 40 to 60% nitrogen, plus incidental impurities.

17. A coating according to claim 13, wherein an additional oxi-nitride layer is contacting and overlying the surface of the nitride layer; the oxi-nitride layer comprising a superlattice type interlayer with TiAlYN and CrN layers and a glassy overcoat region.

18. A coating according to claim 13, wherein the substrate composition is an alloy comprising titanium and aluminium.

19. A coating according to claim 13, wherein the substrate composition is selected from the group consisting of a near-alpha titanium alloy, an alpha+beta titanium alloy, an alpha-2 titanium aluminide alloy, an orthorhombic titanium aluminide alloy, and a gamma titanium aluminide alloy.

20. A coating according to claim 13, wherein the ceramic layer is yttria stabilized zirconia, further comprising an oxide selected from the group consisting of perowskites, pyrochlores and yttrium aluminium garnet-based ceramics.

21. An article comprising a metal substrate having a substrate composition and a substrate surface, having thereon a coating, the coating contacting and overlying at least a portion of the substrate surface; the coating comprising a nitride layer contacting the substrate surface and having a composition, in atomic percent, of from 5 to 30% titanium, of from 10 to 40% aluminium, of from 1 to 40% chromium, of from 0 to 3% yttrium, of from 40 to 60% nitrogen, plus incidental impurities, wherein the coating further comprises a ceramic layer contacting and overlying the nitride layer, such that the nitride layer lies between the ceramic layer and the substrate.

22. An article according to claim 21, wherein the substrate is a titanium containing substrate.

23. An article according to claim 21, wherein the substrate is a component of an aircraft gas turbine, a stationary gas turbine or an engine part for automotive applications.

* * * * *